United States Patent [19]

Garcia

[11] Patent Number: 4,879,683
[45] Date of Patent: Nov. 7, 1989

[54] A GAAS REGISTER FILE HAVING A PLURALITY OF LATCHES

[75] Inventor: Virgilio N. Garcia, Dallas, Tex.

[73] Assignee: Texas Instruments Incorporated, Dallas, Tex.

[21] Appl. No.: 101,620

[22] Filed: Sep. 28, 1987

[51] Int. Cl.$^4$ .................. G11C 7/00; H03K 19/094
[52] U.S. Cl. .................. 365/189.05; 365/154; 307/450; 307/481
[58] Field of Search .............. 365/189, 154, 194, 233; 307/481, 448, 450

[56] References Cited

U.S. PATENT DOCUMENTS 4,587,440 5/1986 Nakayama et al. .................. 307/268

FOREIGN PATENT DOCUMENTS 0179979 11/1982 Japan ..................... 365/233

Primary Examiner—Stuart N. Hecker
Assistant Examiner—Andrew L. Sniezek
Attorney, Agent, or Firm—Rene'E. Grossman; Melvin Sharp

[57] ABSTRACT

A GaAs register file for storing of digital data is configured with a plurality of latches having a data terminal and an enable terminal connected to a write enable circuit. The wire enable circuit provides a write enable strobe signal to enable the latch during the loading of data into the plurality of latches. The write enable circuit has an enable input circuit, a clock input circuit and two combining circuits. The enable input circuit receives an enable signal from an address decode logic and provides a time delay to the enable signal. The clock input circuit receives a clock signal and delays the clock signal signal. The delayed clock signal and enable signal are combined to obtained a combination signal. A second clock delay is provided by plurality of series connected GaAs gates which defines the width of the write enable puse. The second clock delayed signal is ANDED with the combination signal to obtained the write enable strobe signal.

6 Claims, 3 Drawing Sheets (A) CROSS SECTION

A GAAS REGISTER FILE HAVING A PLURALITY OF LATCHES

BACKGROUND OF THE INVENTION

This invention relates to semi-insulator circuits and in particular to Gallium Arsenide circuits connected to form a register file.

Microprocessors typically have an Arithmetic Logic Unit (ALU) that is connected to a register file in which the operands that are to operated upon by the ALU are stored. When a particular register in the register file is addressed and enabled, then the contents of that register file are applied to the ALU for adding to the contents of a second register in the register file that is also addressed and enabled.

The register files, to minimize the effects of line transients, have been configured with "D" type flip-flops. However, because of the number of gates required to configure a "D" type flip-flop and the additional cost in speed, even with GaAs heterojunction integrated injection logic (HI²L), R-S latches are preferred for configuring the register if protection against line transients can be provided.

SUMMARY OF THE INVENTION

A GaAs register file for storing of digital data is configured with a plurality of latches having a data terminal and an enable terminal connected to a write enable circuit. The write enable circuit provides a write enable strobe signal to enable the latch during the loading of data into the plurality of latches. The write enable circuit has an enable input circuit, a clock input circuit and two combining circuits. The enable input circuit receives an enable signal from an address decode logic and provides a time delay to the enable signal. The clock input circuit receives a clock signal and delays the clock signal. The delayed clock signal and enable signal are combined to obtain a combination signal. A second clock delay is provided by a plurality of series connected GaAs gates which define the width of the write enable pulse. The second clock delayed signal is ANDed with the combination signal to obtain the write enable strobe signal.

The combination of signals because of the use of HI²L gates is performed by wired AND circuits.

The GaAs register file includes a plurlity of R-S latches that provide high speeds with a minimum number of gates while providing transient protection through the use of the write enable circuit.

These and other objects and advantages will be apparent from a reading of the specification in conjunction with the figures in which:

DETAILED DESCRIPTION OF THE EMBODIMENTS

Figure 1:
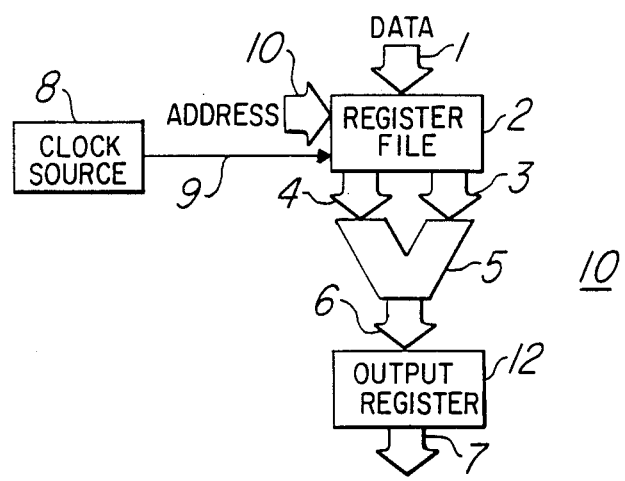
FIG. 1 is a block diagram of a GaAs microprocessor system.

FIG. 1, to which reference should now be made, is a simplified block diagram of a GaAs microprocessor system such as that disclosed in the October 1986 issue of the IEEE publication, Computer, entitled "Reduced Instruction Set Architecture for a GaAs Microprocessor System" by Fox et al which by reference is incorporated herein. A register file 2 stores operands for use by an ALU 5 in the form of data provided thereto via a data bus 1. When the register file 2 is addressed by addresses supplied thereto by an address bus 10. The operands are applied to the ALU 5 by data buses 3 and 4. After the ALU 5 has mathematically combined the two operands, the output is stored in an output register 12 which provides the results to the output data bus 7.

Figure 2:
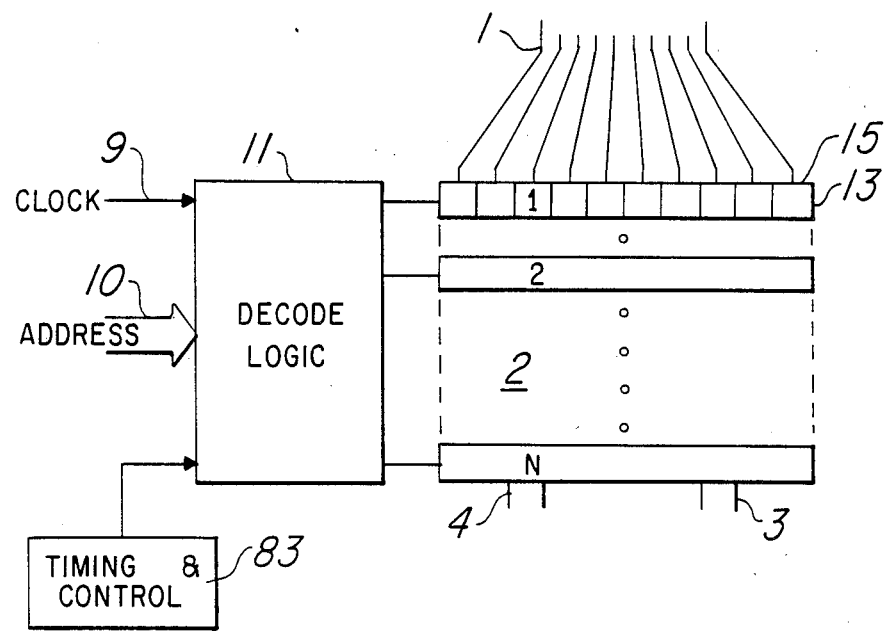
FIG. 2 is a block diagram of a GaAs register file for the microprocessor of FIG. 1.

As is shown in FIG. 2, the register file 2 includes a decode circuit 11 which is a device such as a programmable logic array (PLA) or a ROM that receives each address via data bus 10. Each of the addresses in the embodiment of FIG. 2, where the register file 2 has 16 registers of 32 bit words, is applied to the decode logic 11 and is decoded into a single signal that specifies a particular row of registers 13 of 1 through N where N is equal to 16 in the illustrated embodiment. Each register 13 has 32 discrete latch stages 15.

Figure 3:
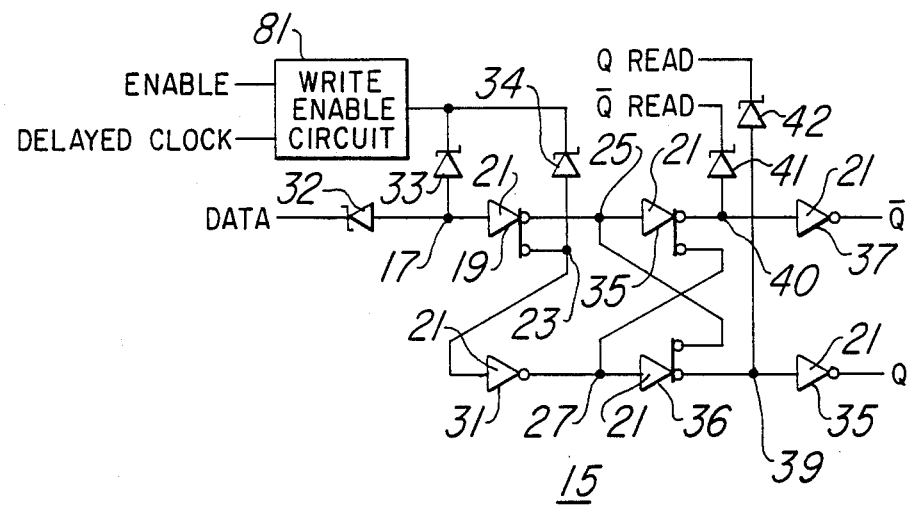
FIG. 3 is a schematic diagram of a single latch of the register set of FIG. 2.

Referring to FIG. 3, each latch stage 15 receives data via a blocking diode, Schottky diode 32 and a write enable strobe signal via a write enable circuit 81 and a blocking diode 33. The write enable strobe signal is combined with the data signal at the wire AND point 17 and applied to an input gate 19 which is a GaAs gate. The output of the input gate 19 is a dual output with one output being applied to the set gate 35 of the R-S latch stage 15 via a wire AND point 25. The wire AND point 25 combines the output of the reset gate 36 with the output of the input gate 19. Additionally, the output of the input gate 19 is combined with the write enable strobe signal and applied to a second input gate 31. The output of the input gate 31 is also applied to the reset gate 36. Gate 38 is the Q output of the latch stage which is enabled via a Q read signal that is applied to a wire AND point 39 via Schottky diode 42 and the $\overline{Q}$ output is provided on the output of buffer gate 37 which is the output of the set latch 35 as combined with a $\overline{Q}$ read signal that is applied to wire AND point 40 via Schottky diode 41.

Figure 4:
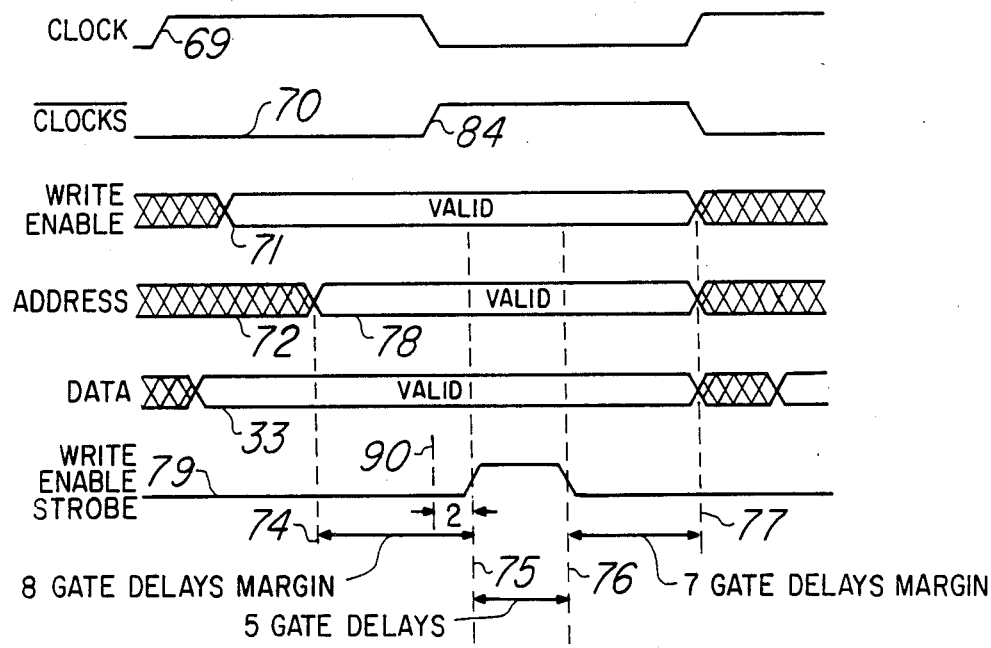
FIG. 4 is a waveform diagram showing the timing for the operation of the write enable circuit of FIG. 3.

To insure that the data that is stored in each R-S latch stage 15 is not affected by transients, a write enable pulse, which is the write enable strobe signal, is applied to Schottky diodes 33 and 34 and is generated by the write enable circuit 81. The write enable strobe signal is a pulse that includes the output from the clock source 8 that is represented by waveform 69 of FIG. 4. The clock signal is delayed and applied to the the write enable circuit 81 and is represented by waveform 70 of FIG. 4 as the $\overline{\text{clock}}$ signal. The $\overline{\text{clock}}$ is illustrated in FIG. 4 as an inverted clock signal but actually in the embodiment shown it is a delayed signal of the clock signal that is represented by waveform 69. Delaying the clock signal to obtain a second clock signal is preferred over inverting the clock signals in the applications where a system designer requires the capability of changing the clock duty cycle.

A write enable strobe signal is provided by a timing and control circuit 83 of FIG. 2 and illustrated by the representation of waveform 71 and in particular is valid during the area of waveform 71 marked valid in FIG. 4. The addresses that are applied to the decode logic 11 via address bus 10 are represented by waveform 72 and are valid during period 78. During the period 78, the valid period, the address is decoded by the decode logic 11 and applied to the addressed register 13 of the register file 2. Prior to the write enable being applied from the timing and control logic to the decode logic 11, the data on the data bus 1 is valid as indicated by waveform 33. The write enable strobe signal that is applied to the Schottky diodes 33 and 34 is represented by waveform 79 and it provides an eight gate delay margin prior to the write enable being present to load the data on data bus 1 into the addressed register 13. This is indicated at dotted line 75 and the eight gate time delay is provided by the position of the rising edge 84 of the of clock signal. The write enable strobe signal is present in the case of FIG. 2 for five gate delays and then there is a seven gate delay margin after the write enable signal is removed. This delay is represented by the distance between lines 76 and 77.

Figure 5:
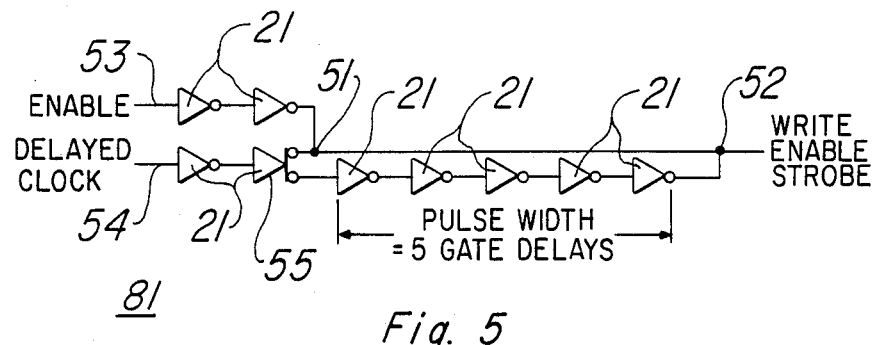
FIG. 5 is a schematic diagram of the write enable circuit of FIG. 3.

The write enable circuit 81 is illustrated in FIG. 5. The enable strobe signal is applied to the write enable circuit from the timing and control logic 83 (FIG. 2) at terminal 53 and ANDED with the clock signal after both signals have been delayed by two gate delays at the wired AND point 51. The clock is applied via line 54 to the two gates 21 that provide two gate delays which is represented by the distance between lines 90 and 75 of FIG. 4. A pulse width delay circuit that includes five gates provides an additional delay of five gates to the clock that is provided as an output from the gate 55. This delay which correspond to the width of the write enable strobe signal can be any value provided that the number of gates because of the inverting function is an odd number. With an even number of gates, the write enable would always be a logic 0. The output of the gate delay is combined with the AND output of the enable and clock signal at wire AND point 52 to obtain the write enable strobe signal illustrated as waveform 79 of FIG. 4.

Figure 6:
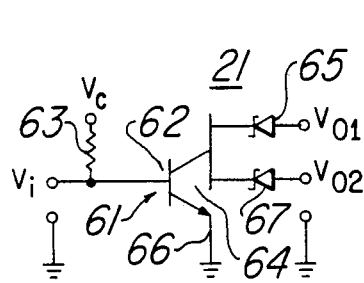
FIG. 6 is a schematic diagram of the gates used in the embodiments of FIGS. 3 and 4.

FIG. 6 is a schematic diagram of each gate 21 that is used to practice this invention. Other types of HI²L gates such as those described in U.S. Pat. Nos. 4,573,064; 4,654,960 and 4,672,414 may be used to practice the invention. Although some of the gates 21 are illustrated having a single output, others have multiple outputs, the number of Schottky diodes on the output circuit being selected in the manufacturing process to achieve the desired arrangement. There is a pull up resistor 63 that is connected to the base 62 of a transistor 61. The emitter 65 is grounded and the collector 64 is connected to the output Schottky diodes 65 and 67. Using HI²L logic, the AND functions are wire AND as is shown in the previus discussions with the outputs being fanned out through the use of the connection of the Schottky diodes 65 and 67. With the HI²L gate configuration any of the disclosed circuit logic configurations can be achieved with the gate of FIG. 6.

Figure 7:
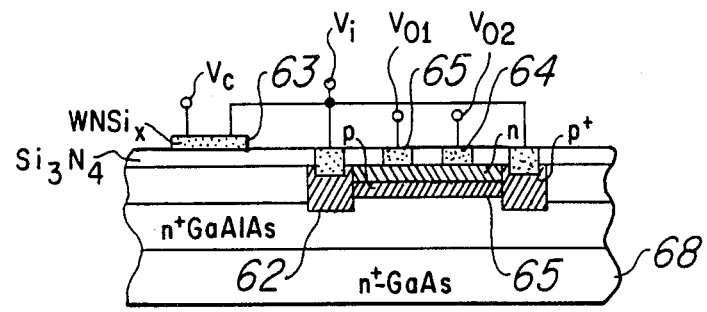
FIG. 7 is a cross sectional diagram illustrating the fabrication of the gate of FIG. 6 is GaAs.

FIG. 7 illustrates a cross sectional view of a simplified HI²L gate of FIG. 6 in which tungsten nitride silicide is used to create the resistor 63. The gate 62 and the Schottky diode 65 and 67 are shown as is the emitter 65. These devices are fabricated on a slice of GaAs 68 as is shown in FIG. 7.

Accordingly, I claim:
1. A GaAs register file comprising:
a plurality of latches, each latch having a data input terminal and a write enable circuit having a write enable strobe connected thereto, said write enable circuit comprising:
a first input circuit including at least a single GaAs gate with an input and at least a first and second output;
a second input circuit including at least a single input gate with an input and a first output;
a first combining circuit with inputs connected to the first outputs of the first and second circuits and including an output;
a plurality of series connected GaAs gates having an input and an output with an input being connected to a second output of the first input circuit; and
a second combining circuit with inputs connected to an output of the first combining circuit and the output of the plurality of series connected GaAs gates and having its output connected to the write enable strobe.

2. The GaAs register file according to claim 1 wherein the first and second combining circuits each comprise:
a wired AND circuit.

3. The GaAs register file according to claim 1 wherein the plurality of series connected gates comprises an odd number of gates.

4. The GaAs register file according to claim 1 wherein the each latch comprises an R-S latch.

5. The GaAs register file according to claim 4 wherein each R-S latch comprises:
a first input GaAs gate;
a second GaAs gate having an input and an output;
a third combining circuit having its inputs connected to the write enable strobe and the data terminal and connected to an input of the first gate; and
a fourth combining circuit having its inputs connected to the output of the first gate and the write enable strobe and connected to the input of the second GaAs gate.

6. A GaAs register file means for storing of digital data comprising:
a plurality of latches having a data terminal and an enable terminal connected to a write enable circuit for providing a write enable strobe signal to enable one of said latches during the loading of data into the plurality of latches, the write enable circuit comprising:
a first input circuit for receiving a first signal and to provide a first time delayed signal;
a second input circuit for receiving a second signal and to provide a second time delayed signal;
a plurality of series connected GaAs gates operatively connected to an output of the second input circuit to provide a third time delay signal;
a first combining circuit for combining the first and second time delayed signals to obtain a fourth signal; and
a second combining circuit for combining the third time delayed signal with the fourth signal to obtain the write enable strobe signal whereby;
said first and second combining circuits each comprising a wired AND circuit;
each said latch being and R-S latch;
wherein each R-S latch comprises:
a first input GaAs gate having an input and an output;

a second GaAs gate having an input and an output;
a third combining circuit having its inputs connected to the write enable terminal and the data terminal and connected to an input of the first gate; and
a fourth combining circuit having its inputs connected to the output of the first gate and the write enable terminal and having an output connected to the input of the second GaAs gate.

* * * * *